United States Patent
Yoo

[19]

[11] Patent Number: 6,157,559
[45] Date of Patent: Dec. 5, 2000

[54] APPARATUS AND METHOD FOR UPDATING ROM WITHOUT REMOVING IT FROM CIRCUIT BOARD

[75] Inventor: Chang-Woong Yoo, Suwon, Rep. of Korea

[73] Assignee: SamSung Electronics Co., Ltd., Suwon, Rep. of Korea

[21] Appl. No.: 09/096,620

[22] Filed: Jun. 12, 1998

[30] Foreign Application Priority Data

Sep. 23, 1997 [KR] Rep. of Korea .................. 97-48203

[51] Int. Cl.⁷ ..................................................... G06F 12/00
[52] U.S. Cl. ............................................. 365/52; 711/103
[58] Field of Search ................................ 365/52, 51, 63; 711/102, 103

[56] References Cited

U.S. PATENT DOCUMENTS

| 4,156,926 | 5/1979 | Hartman ................................... 364/900 |
| 4,325,130 | 4/1982 | Tiltscher ................................... 364/900 |
| 5,036,488 | 7/1991 | Motarjemi ................................... 365/52 |
| 5,081,675 | 1/1992 | Kittirutsunetorn ......................... 380/4 |
| 5,535,357 | 7/1996 | Moran et al. . |
| 5,592,000 | 1/1997 | Onishi et al. . |
| 5,602,738 | 2/1997 | Sasaki ................................ 364/431.12 |
| 5,687,345 | 11/1997 | Matsubara et al. . |
| 5,729,767 | 3/1998 | Jones et al. . |
| 5,787,381 | 7/1998 | Sasaki ..................................... 701/115 |
| 5,864,463 | 1/1999 | Tsukada et al. ......................... 361/686 |

*Primary Examiner*—Eddie P. Chan
*Assistant Examiner*—Kevin Verbrugge

*Attorney, Agent, or Firm*—Robert E. Bushnell, Esq.

[57] ABSTRACT

An updater device for flash read-only memory is provided. The updater device may be constructed using a power input interface that transfers battery from either a battery or an electrical adapter to the updater device. The updater device has a body containing circuitry that controls the operations of the device. Located in the body is an input, or first, port and an output, or second, port for engaging flash read-only memories. A source flash read-only memory is inserted into the input port and the updater is then placed over the target flash read-only memory so that the updater device engages the target flash memory. A button that is located on the body activates the updating process. First the microprocessor reads data from the source flash read-only memory via a first read-only memory interface located in the input port. Then the microprocessor uses a second read-only memory interface in the second port to erase the target read-only memory. Next, the microprocessor encodes the data read from the source flash memory onto the target flash memory. Before ending the updating process, the updater device confirms that the data encoded on the target flash read-only memory matches that previously read from the source flash read-only memory. During the updating process, the target flash memory is not removed from the attached printed circuit board. Light emitting diodes are attached to the body of the updater device to indicate the status of the updating process. After the newly encoded data on the target flash memory is confirmed a light emitting diode is activated to inform the user whether the target flash memory was properly encoded.

16 Claims, 8 Drawing Sheets

APPARATUS AND METHOD FOR UPDATING ROM WITHOUT REMOVING IT FROM CIRCUIT BOARD

CLAIM OF PRIORITY

This application makes reference to, incorporates the same herein, and claims all rights accruing thereto under 35 U.S.C. §119 through my patent application entitled A Flash ROM Writer and a Control Method Thereof earlier filed in the Korean Industrial Property Office on Sep. 23, 1997 and there duly assigned Serial No. 1997/48203.

BACKGROUND OF THE INVENTION

1. Field of the Invention

The present invention relates to read-only memory and, more specifically, to a flash read-only memory updater apparatus and method.

2. Background Art

Today, computers use permanent memory to store the software code that provides essential low-level services, commonly called Basic Input/Ouput Services, some type of storage device to provide access to an operating system that provides higher level services, and some type of storage device that allows a user to run application programs and retrieve stored data. For example, one configuration is for a personal computer to have the Basic Input/Output Services stored in an integrated circuit located on the motherboard, and to provide volatile memory chips, commonly referred to as random access memory, into which programs or parts of programs are retrieved from a secondary storage device for operation.

As technological demands on computers increase the area of solid state disk technology has been increasingly researched to develop improved computer components. The concept behind solid state disk technology is to use integrated circuits, such as random operating memory, random access memory, and electrically erasable programmable read-only memory, not only as primary system memory, but also as secondary storage so that hard disk drives can be replaced. The process of re-encoding read-only memory, however, is self-limiting because as the number of electrons on the floating gate of the memory cell increases, the potential of the floating gate decreases until the potential on the floating gate is insufficient to create a detectable current in the channel section of the memory cell.

A new type of solid state memory, called flash memory, has recently been used in solid state disk technology applications. Flash memory components are constructed of arrays of electrically erasable programmable read-only memory devices that can be simultaneously erased. Flash memory components have very favourable attributes, such as fast access, low power consumption, high reliability, and relatively low cost. Technological developments related to flash memory are shown, for example, in U.S. Pat. No. 5,592,000 to Onishi entitled Non-Volatile Semiconductor Memory Device Programmable and Erasable at Low Voltage, U.S. Pat. No. 5,687,345 to Matsubara entitled Microcomputer Having CPU and Built-In Flash Memory That is Rewritable Under Control of the CPU Analyzing a Command Supplied from an External Device, U.S. Pat. No. 5,729,767 to Jones entitled System and Method for Accessing Peripheral Devices on a Non-Functional Controller, and U.S. Pat. No. 5,535,357 to Moran entitled Flash Memory System Providing both BIOS and User Storage Capability. When the data that is stored in flash memory is flawed, as originally installed, or in need of being upgraded due to a corresponding upgrade of the associated computer, the flash random access memory must be separated from the printed circuit board using a soldering iron, or equivalent technique. Then, the flash memory must be inserted in an updater, and then remounted onto the printed circuit board. As such, it is difficult for a user to update the flash memory and the printed circuit board can be damaged by the high amounts of heat generated from the soldering iron or the flash memory can be damaged in the act of removing it and securing it onto the printed circuit board.

I believe that it may be possible to improve on the contemporary art by providing a flash memory updater that can update a flash memory without removing it from a printed circuit board, that is easy for a user to operate, reduces the cost of updating flash memory by eliminating the flash memory removal and re-attaching steps, and allows for the efficient and for more timely upgrade of flash memory.

SUMMARY OF THE INVENTION

Accordingly, it is an object of the present invention to provide an improved flash read-only memory updater.

It is another object to provide a flash read-only memory updater and a control method that can update a flash read-only memory without requiring that the flash memory be removed from the printed circuit board.

It is still another object to provide a flash read-only memory updater and a control method that is easy for a user to operate.

It is yet another object to provide a flash read-only memory updater and a control method that reduces the cost of updating flash memory by eliminating the flash memory removal and re-attaching steps.

It is still yet another object to provide a flash read-only memory updater and a control method that is easy for a user to manipulate.

It is a further object to provide a flash read-only memory updater and a control method that increases the efficiency and speed of flash memory upgrade.

To achieve these and other objects, an updater device for flash read-only memory is provided. The updater device may be constructed using a power input interface that transfers battery from either a battery or an electrical adapter to the updater device. The updater device has a body containing circuitry that controls the operations of the device. Located in the body is an input, or first, port and an output, or second, port for engaging flash read-only memories. A source flash read-only memory is inserted into the input port and the updater is then placed over the target flash read-only memory so that the updater device engages the target flash memory. A button that is located on the body activates the updating process. First the microprocessor reads data from the source flash read-only memory via a first read-only memory interface located in the input port. Then the microprocessor uses a second read-only memory interface in the second port to erase the target read-only memory. Next, the microprocessor encodes the data read from the source flash memory onto the target flash memory. Before ending the updating process, the updater device confirms that the data encoded on the target flash read-only memory matches that previously read from the source flash read-only memory. During the updating process, the target flash memory is not removed from the attached printed circuit board. Light emitting diodes are attached to the body of the updater device to indicate the status of the updating process. After the newly encoded data on the target flash memory is confirmed a light emitting diode is activated to inform the user whether the target flash memory was properly encoded.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE DRAWINGS

Figure 1:
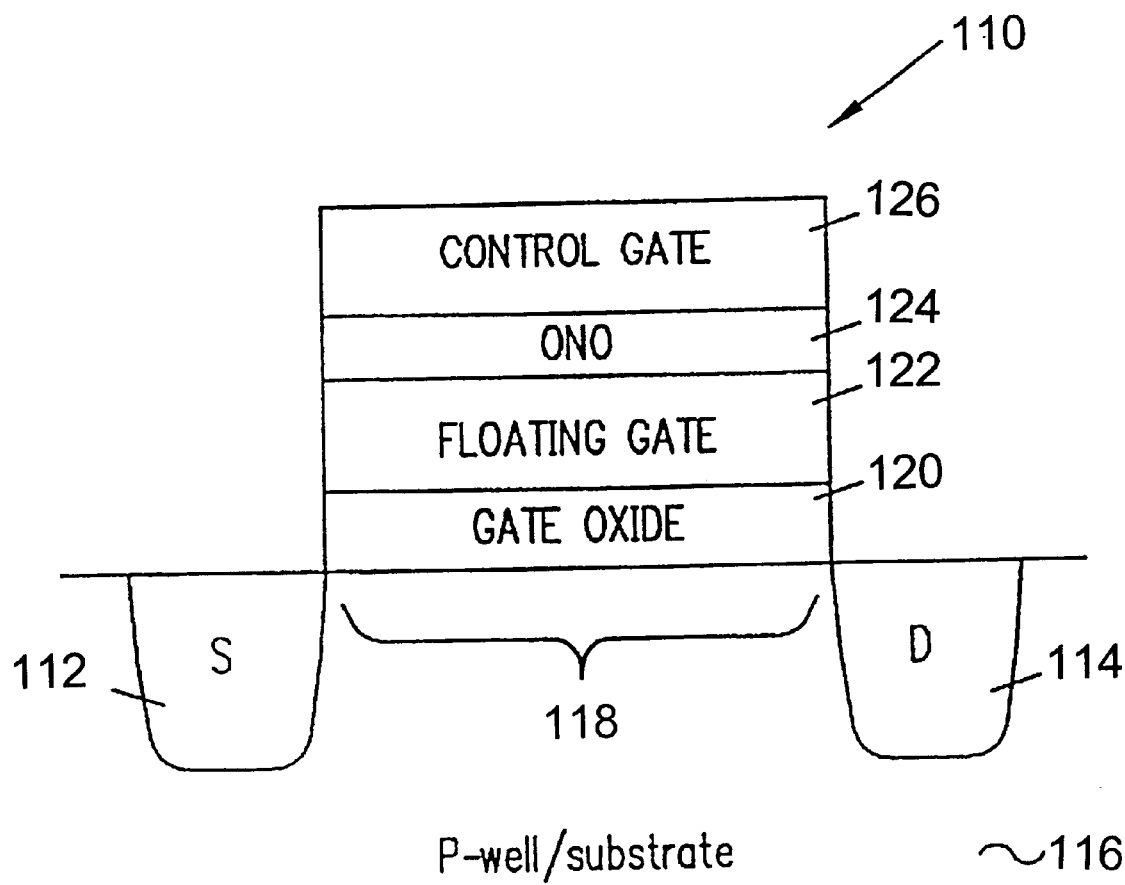
FIG. 1 is a cross-sectional view of a one-micron, n-channel, floating gate memory cell.

Turning now to the drawings, FIG. 1 shows a cross-sectional drawing that illustrates an n-channel, floating gate memory cell 110. Memory cell 110 includes n-type source region 112 and n-type drain region 114 which are formed a distance apart in p-type substrate 116. The surface area of substrate 116 between the source and drain regions 112 and 114 defines channel region 118 which is typically doped with additional p-type dopants (typically boron atoms) to adjust the threshold voltage of the cell.

Formed over channel region 118 of substrate 116 is a stacked gate structure which includes first insulation layer 120, floating gate 122 formed over insulation layer 120, second insulation layer 124 formed over floating gate 122, and control gate 126 formed over insulation layer 124.

With 0.8 micron technology, memory cell 110 is conventionally programmed to store one of the two logic levels, i.e., a logic "1" or a logic "0", by grounding source region 112 and substrate 116, applying bias voltage VD in the range of 6–8 volts to drain region 114, and applying programming voltage VG of approximately 112 volts to control gate 126.

Figure 2:
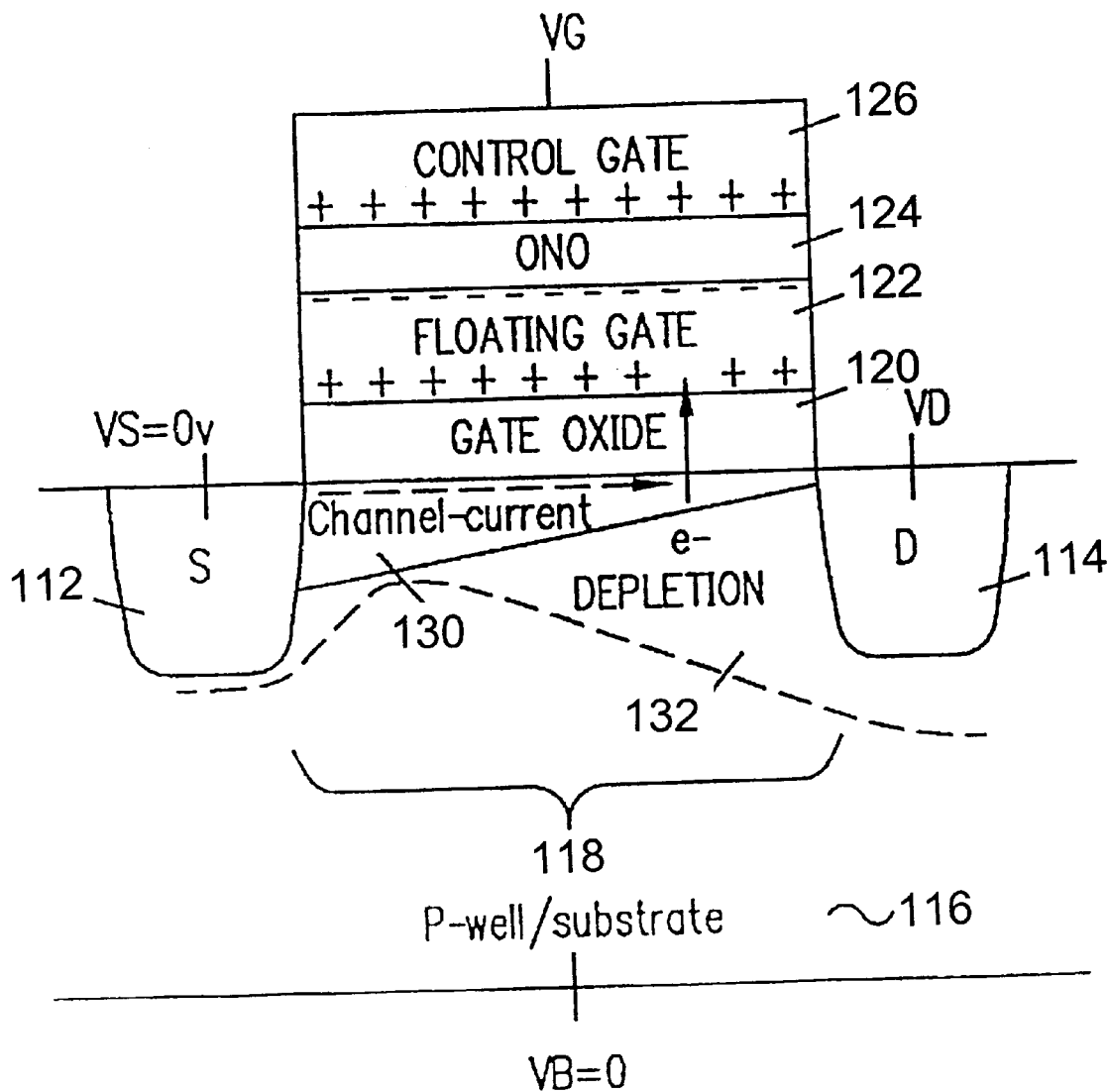
FIG. 2 is a is a cross-sectional view of a the memory cell of FIG. 1 illustrating the biasing conditions that result when the memory cell is programmed.

FIG. 2 shows a cross-sectional drawing that illustrates the result of these bias conditions on memory cell 110. When the programming voltage is applied to control gate 126, a positive potential is induced on floating gate 122. The positive potential on floating gate 122, in turn, attracts electrons from the doped p-type atoms in channel region 118 to surface of substrate 116 to form channel 130, and also repels holes from the doped p-type impurity atoms to form depletion region 132.

When bias voltage VD is applied to drain region 114, an electric field is established between source and drain regions 112 and 114 in channel region 130 and depletion region 132. The electric field accelerates the electrons in channel 30 which, in turn, have ionizing collisions that form "channel hot electrons". The positive potential of floating gate 122 attracts these channel hot electrons which penetrate insulation layer 120 and begin accumulating on floating gate 122.

The negative charge on floating gate 122 that results from the accumulated electrons, in turn, directly corresponds to the threshold voltage required to induce a defined current to flow through memory cell 110. Thus, when a large negative charge has accumulated on floating gate 122, the threshold voltage of the cell is large because a larger positive voltage must be applied to control gate 126 to compensate for the negative charge on floating gate 122. Similarly, if the cell has not been programmed, the threshold voltage is small because a smaller voltage will induce current to flow through the cell.

When memory cell 110 is read, a reference threshold voltage is applied to control gate 126 to again induce a potential on floating gate 122. If memory cell 110 has not been programmed, the positive charge on floating gate 122 will cause channel 130 to again be formed. As a result, current flows from drain region 114 to source region 112 through channel 130.

If memory cell 110 has been programmed, the potential on floating gate 122 is reduced by the accumulated electrons so that a much smaller current flows through channel 130. By then comparing the current to a reference current, the magnitude of the current can be interpreted to be either a logic "1" or a logic "0". In other words, if the threshold voltage of the cell is larger than the reference threshold voltage, then one logic level is present, whereas if the threshold voltage of the cell is smaller than the reference threshold voltage, then the other logic level is present.

Figure 3:
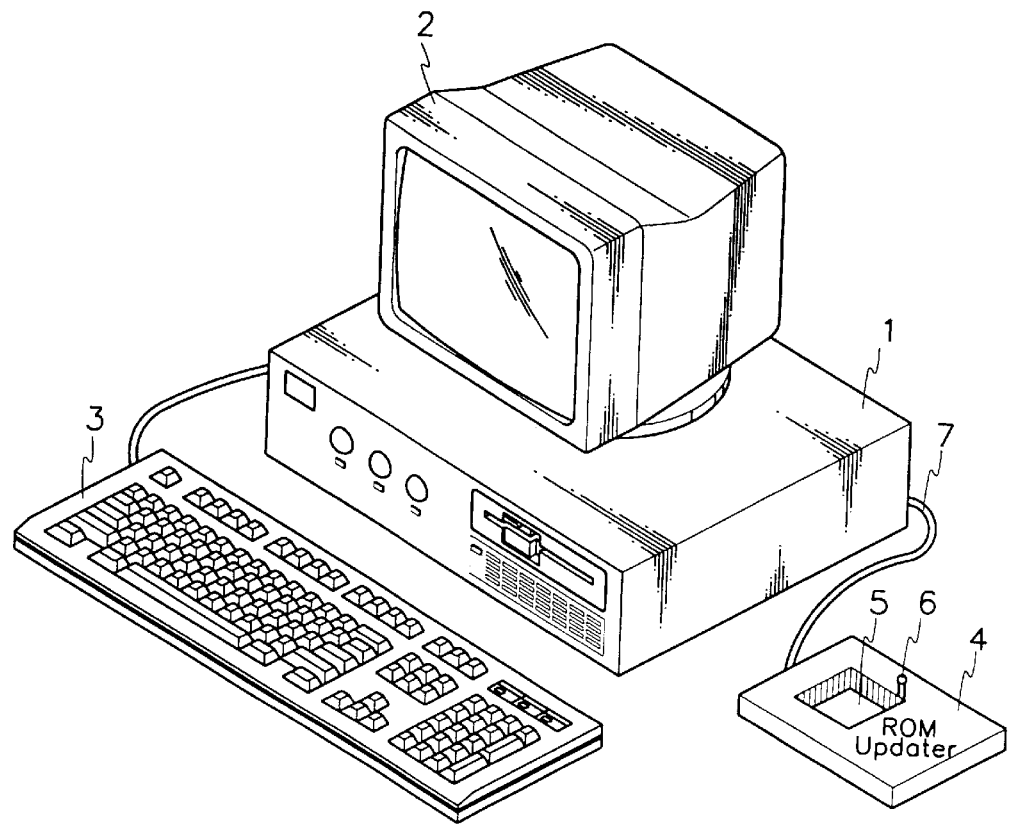
FIG. 3 is a perspective view of a computer system connected to a read-only memory updater.
Figure 4:
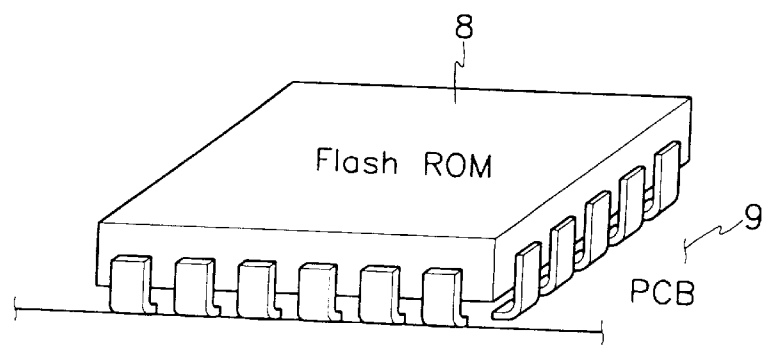
FIG. 4 is a perspective view of a read-only memory.

FIG. 3 illustrates a computer system with flash read-only memory updater 4 attached. The computer system may be constructed using chassis 1, monitor 2, keyboard 3 and flash read-only memory updater 4. Read-only memory updater 4 is connected to chassis 1 via cable 7. A target flash read-only memory may be inserted into read-only memory mounting port 5. A user then erases the target flash memory, reads the new data to be stored on the target flash memory, updates the target flash memory, and confirms the proper encoding of the target flash read-only memory. FIG. 4 illustrates flash read-only memory 8 mounted on printed circuit board 9. Flash read-only memory 8 is manufactured as a Surface Mounted Device and is mounted on printed circuit board 9.

Figure 5:
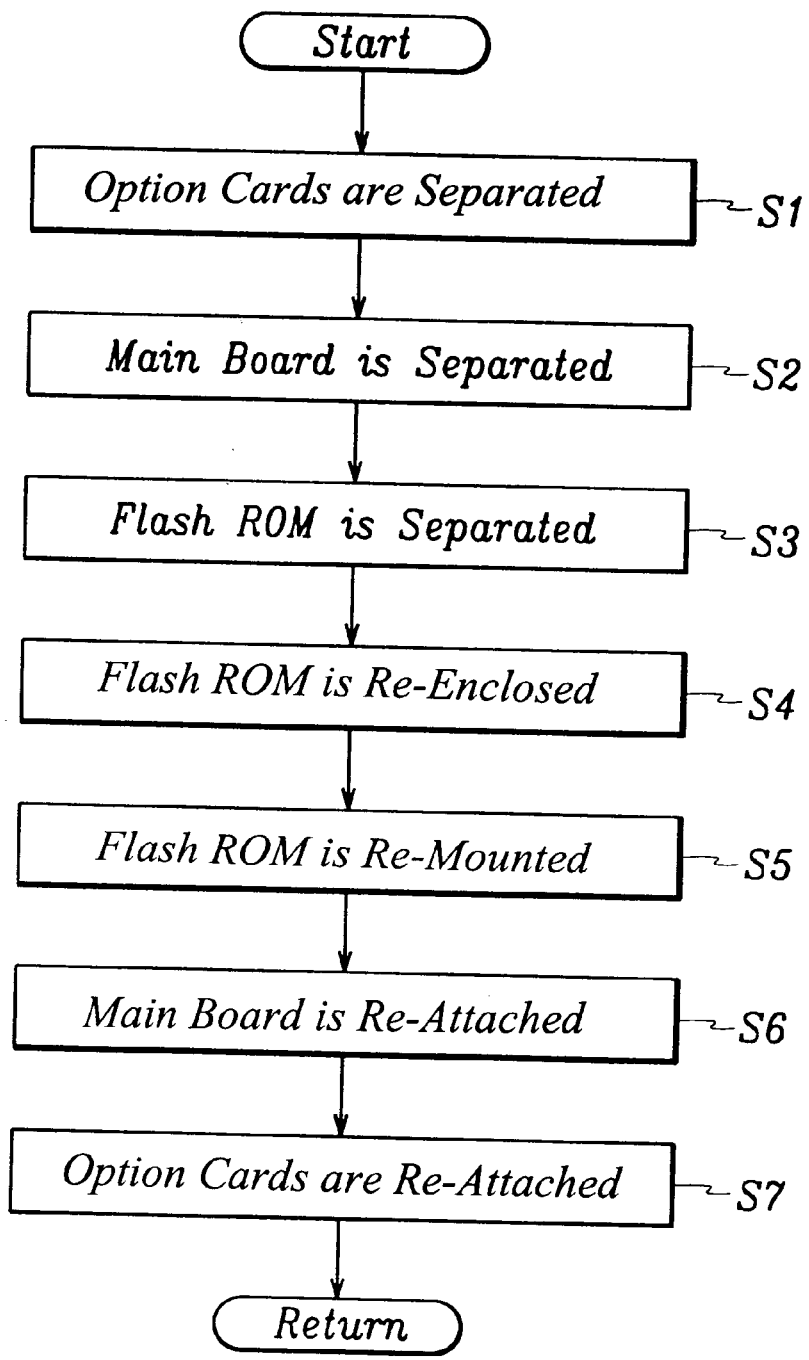
FIG. 5 is a flow chart of a process for re-encoding the data of a flash read-only memory.

FIG. 5 is a flow chart showing a method for re-encoding a flash read-only memory. To start, in step S1, every option card must be separated from the main board. Then, during step S2 the main board is separated from the computer system's chassis. In step S3, the flash read-only memory is separated from the main board and then, during step S4, the data of the flash read-only memory is re-encoded via a flash read-only memory updater. During step S5, the flash read-only memory is re-mounted onto the main board it was originally attached to. Then, in step S6, the main board is reattached to the computer system. Previously separated option cards are then, during step S7, reattached to the main board. The method of FIG. 5 requires the flash read-only memory to be separated from a printed circuit board prior to updating the data of the flash memory.

Figure 6:
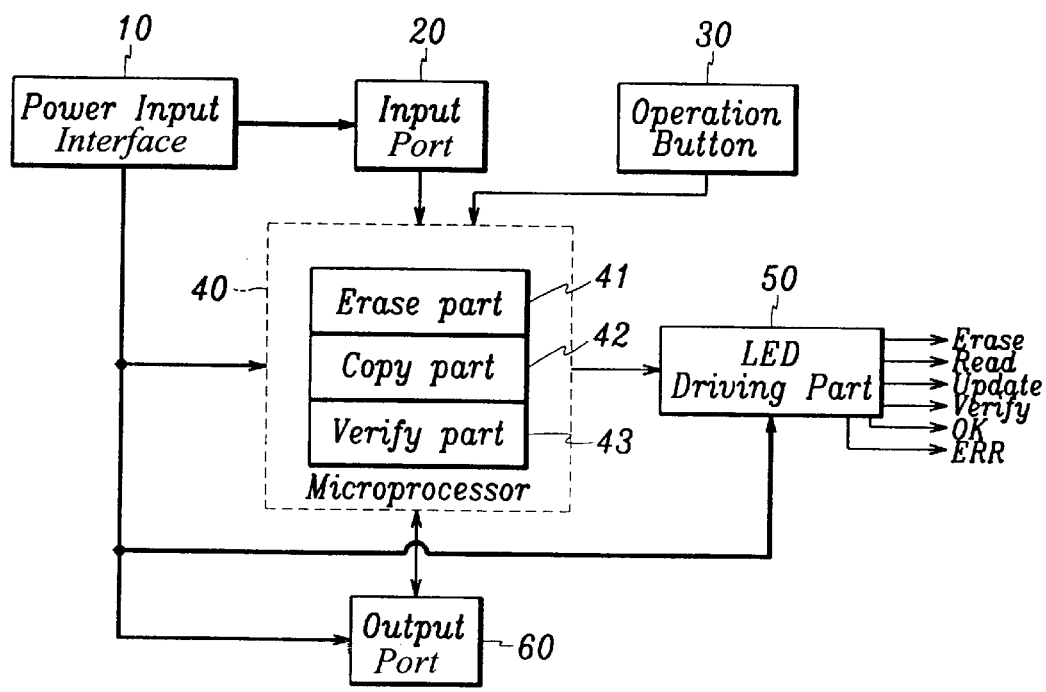
FIG. 6 is a block diagram of a flash read-only memory updater as constructed according to the principles of the present invention.

FIG. 6 illustrates a flash read-only memory updater, or updater device, as constructed according to the principles of the present invention. The updater device may be constructed using power input interface 10 that transfers power from either a battery or an electrical adapter to the updater device. The updater device has body containing circuitry 40 that controls the operations of the device. Located in the body is input, or first, port 20 and output, or second, port 60 for engaging flash read-only memories. A source flash read-only memory is inserted into the input port and the updater is then placed over the target flash read-only memory so that the updater device engages the target flash memory.

Figure 10:
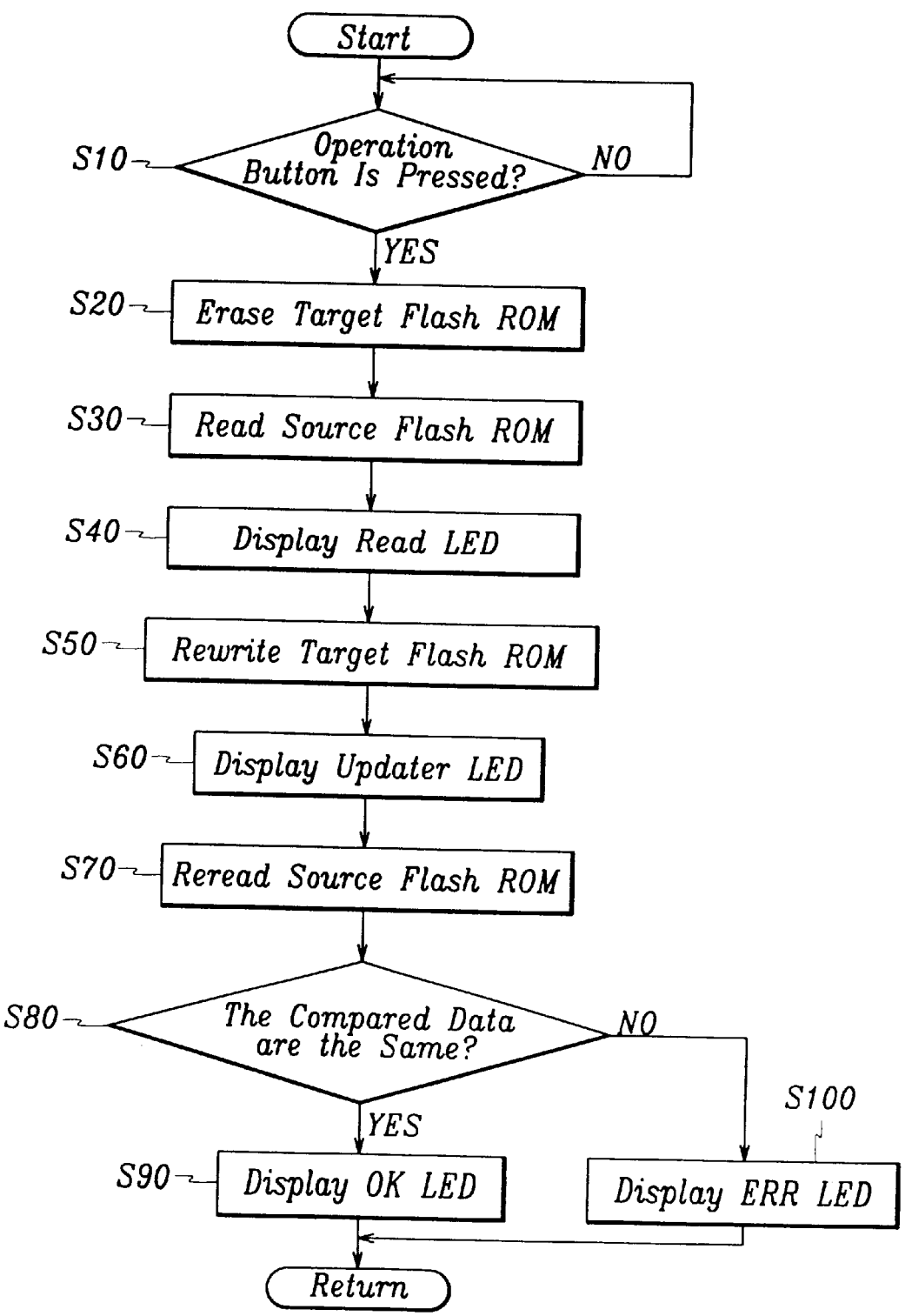
FIG. 10 is a flow chart of a process for re-encoding the data of a target flash read-only memory that does not need to be removed from a printed circuit board during the process.

As shown in FIG. 10, a process controlling the flash read-only memory updater starts with determining whether an operation button is pressed, during step S10. Then, during step S20, the updater device erases the data contained in the flash target read only memory erasing the data of the flash read-only memory. In step S30, the updater device reads data from the source flash read-only memory. After, in step S40, the updater device activates a light emitting diode signifying that an erasing process is occurring. During step S50, the target flash read-only memory is re-encoded. In step S60 a light emitting diode is activated that indicates that a re-encoding process is occurring. During step S70, the updater device re-reads data from the source flash memory. After, during step S80, the microprocessor in the updater device compares and confirms the data of the two flash read-only memories. Then, in step S90, the updater device activates a light emitting diode indicating successful update if the confirmation shows accurate encoding. If the confirmation step reveals an error in the encoding process, then, during step S100, a light emitting diode indicating an error is activated.

Initially, it is possible to read or update the data of the target flash read-only memory, when power is not supplied to the printed circuit board. Accordingly, the output port covers the target flash read-only memory in order to update the data without having to remove the target flash memory from the printed circuit board.

Figure 11:
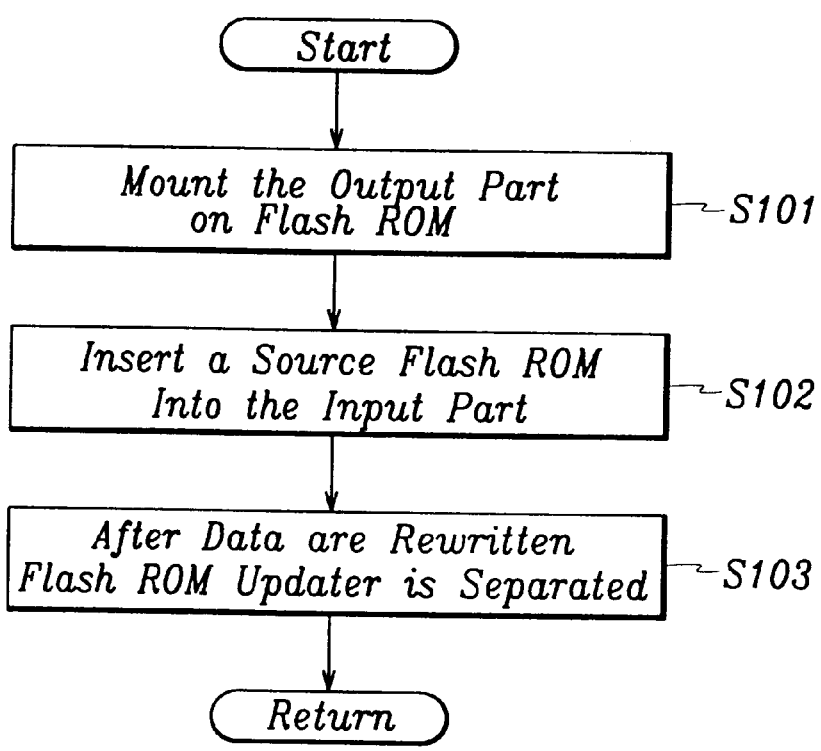
FIG. 11 is a flow chart of a process for using the updater device to re-encode a target read-only memory.

The procedure to use the updater device is shown in FIG. 11. First, during step S101, the flash read-only memory updater is connected to the top of the target flash read-only memory mounted on the printed circuit board formed on the computer body. During step S102, a source flash read-only memory is inserted into the input port of the updater device and the updater reads the data contained in the source flash memory. By pressing the operation button, the data of the flash read-only memory is rewritten, during step S103, and then the flash read-only memory updater is separated from the flash read-only memory.

As shown in FIG. 6, the flash read-only memory updater is supplied DC 12V (source not shown) through power input interface 10. The power source can be either a battery contained within the body of the updater device or supplied to the updater device via an electrical adapter. The power is supplied is used to operate microprocessor 40, light emitting diode driving part 50, output port 60, input port 20, and the status displaying light emitting diodes.

Input port 20 reads the data of the source flash read-only memory after the memory is inserted into input port 20. Then, the data of the source flash read-only memory can be read in preparation for re-encoding the target flash memory. Operation button 30 generates a signal representing an operation command to begin the flash read-only memory updater.

Microprocessor 40 reads the data of the source flash read-only memory that is inserted into input port 20, and performs erasing on the target flash memory, copies data onto the target flash memory, re-reads the source flash memory, and confirms the proper encoding of the target flash memory. Circuitry in microprocessor 40 is broken down into portions dedicated to the tasks of data erasing 41, data copying 42 and data verifying 43. Copy part 42 performs the reading and encoding processes.

During the above-identified processes, light emitting diode driving part 50 activates several light emitting diodes to display the status of the updater device. Different lights are located next to symbols representing various functions, such as Erase, Read, Update, Verify, OK and ERR, for example. The light emitting diodes represent how a series of operations such as erasing, writing and verifying the data of the source or target flash read-only memory are proceeding. Output part 60 erases and rewrites the data of the target flash read-only memory. The target flash read-only memory contacts the printed circuit board while the flash memory is inserted into output port 60.

When operation button 30 is pressed, the data of the target flash read-only memory is erased, the data of the source flash read-only memory is read, the data of the target flash read-only memory is re-encoded, and then, the data of the source and target flash read-only memories are compared and the appropriate light illuminating diode is activated to indicate the accuracy of the updating process.

Figure 7:
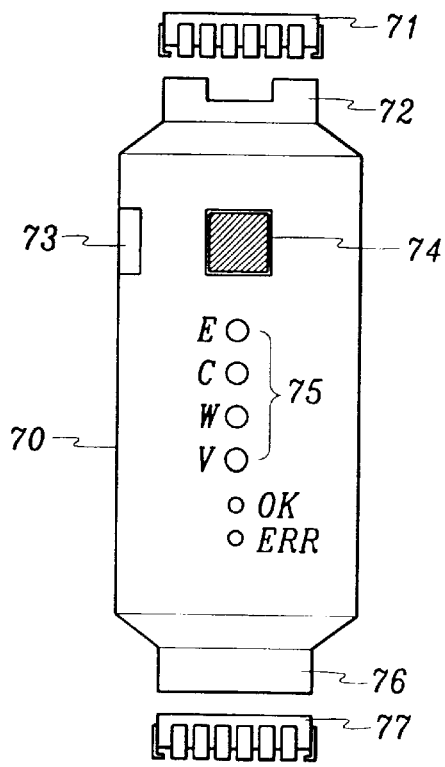
FIG. 7 is a perspective view of the flash read-only memory updater of FIG. 6.

FIG. 7 is a front view of the flash read-only memory updater. The updater device may be constructed using chassis 70, source flash read-only memory 71, an input port 72, power input interface 73, operation button 74, light emitting diodes 75, output port 76, and target flash read-only memory 77.

Figure 8:
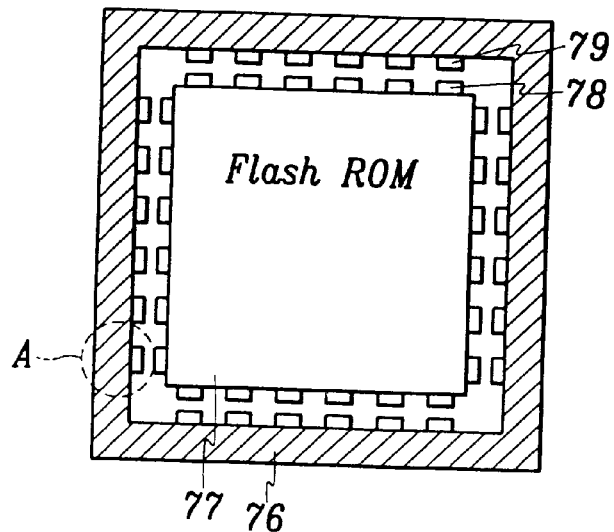
FIG. 8 is a cross-sectional view of a flash read-only memory connected to an input port or an output port of the updater device of FIG. 6.
Figure 9:
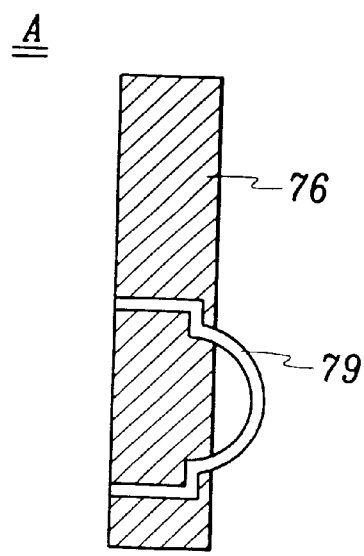
FIG. 9 is a cross-sectional view of a pin of a board spring structure as constructed according to the principles of the present invention.

FIG. 8 illustrates target flash read-only memory 77 mounted in output part 76. Pin 78 of the flash read-only memory and pin 79 of output part 76 are engaged. FIG. 9 is showing pin 79 of output port 76 in the form of a circular board spring.

Accordingly, when the flash read-only memories 71 and 77 are mounted in the input and output ports 72 and 76 respectively, pin 79 of the circular board spring is easily pressed so that flash read-only memory 71 and 77 are connected and fixed into the input and output ports 71 and 76, respectively.

In the meantime, as shown in FIG. 10, a process controlling the flash read-only memory updater starts with determining whether an operation button is pressed. Then, during step S20, the updater device erases the data contained in the flash target read only memory erasing the data of the flash read-only memory. In step S30, the updater device reads data from the source flash read-only memory. After, in step S40, the updater device activates a light emitting diode signifying that an erasing process is occurring. During step S50, the target flash read-only memory is re-encoded. In step S60 a light emitting diode is activated that indicates that a re-encoding process is occurring. During step S70, the updater device re-reads data from the source flash memory. After, during step S80, the microprocessor in the updater device compares and confirms the data of the two flash read-only memories. Then, in step S90, the updater device activates a light emitting diode indicating successful update if the confirmation shows accurate encoding. If the confirmation step reveals an error in the encoding process, then, during step S100, a light emitting diode indicating an error is activated.

Accordingly, when the source flash read-only memory is inserted into the input port and the operation button is pressed, the erase light emitting diode is turned on and the data of the target flash read-only memory are erased. Next, the data of the target flash read-only memory is re-encoded and the update light emitting diode is turned on. And after the data of the source and target flash read-only memory are compared, if the data of the two are the same, the OK light emitting diode is turned on and, if not, the ERR light emitting diode is turned on or, alternatively, the entire set of light emitting diodes can flicker.

The updater device of the present invention can be used to restore damaged data in flash read-only memory without removing the flash memory from printed circuit boards and remove errors. The flash read-only memory updater and a control process eliminate several potential troublesome errors that accompany removing and reattaching flash memories from printed circuit boards. Thus, the updater device simplifies repairs and reduces the amount of time used and the cost of repairs or updates of flash read-only memory.

Although this preferred embodiment of the present invention has been disclosed for illustrative purposes, those skilled in the art will appreciate that various modifications, additions and substitutions are possible, without departing from the scope and spirit of the invention as disclosed in the accompanying claims. It is also possible that other benefits or uses of the currently disclosed invention will become apparent over time.

What is claimed is:

1. A self-powered, portable, hand-held, in situ updater device for read-only memory (ROM) attached to a printed circuit board, said updater device comprising:

a portable body having a substantially cylindrical shape, adapted to be held in a user's hand, said body containing a controller and, connected to said controller, a battery for powering said controller;

coupled to said controller, a first port located in said body, adapted for engaging a source ROM, said first port adapted for reading data from said source ROM when engaged therewith, and said first port adapted for maintaining engagement with said source ROM;

coupled to said controller, a second port located in said body, adapted for engaging a target ROM that remains attached to a printed circuit board, said second port adapted for reading data from and writing data to said target ROM when engaged therewith, and said second port adapted for maintaining engagement with said target ROM; and said controller adapted for:

generating and transmitting to said second port erasure signals for erasing an old datum from said target ROM;

receiving and reading a new datum from said first port; and generating and transmitting to said second port re-write signals for writing said new datum into said target ROM.

2. The updater device of claim 1, wherein said controller is further adapted for reading a newly coded datum that said controller has encoded into said target ROM and confirming whether said newly coded datum is identical to a new datum that said controller has received and read from said source ROM.

3. The updater device of claim 2, further comprising an accuracy indicator mechanism coupled to said controller, said accuracy indicator mechanism indicating by a signal visually or audibly perceptible to said user whether said newly coded datum is confirmed as identical to said new datum that said controller has received and read from said source ROM.

4. An updater device according to claim 3 wherein said accuracy indicator mechanism comprises a first LED and a second LED;

said first LED is illuminated when said newly coded datum is confirmed as identical to said new datum that said controller has received and read from said source ROM; and said second LED is illuminated when said newly coded datum is confirmed as non-identical to said new datum that said controller has received and read from said source ROM.

5. The updater device of claim 1, wherein said controller comprises a programmed microprocessor chip, whereby said controller reads, erases, and writes data automatically when actuated.

6. The updater device of claim 1, wherein:

said first port comprises a semiconductor chip socket adapted for engaging a source ROM plugged thereinto and adapted for making electrical contact with each of a plurality of leads of said source ROM;

said second port comprises a peripheral-contact member adapted to fit around a target ROM mounted in a printed circuit board, to maintain engagement with said ROM, and to make and maintain electrical contact with each of a plurality of leads of said ROM; and said controller is adapted for reading data from a plurality of addresses within said source ROM via said socket of said first port, for erasing data from a plurality of addresses within said target ROM via said peripheral-contact member of said second port, and for writing data to a plurality of addresses within said target ROM via said peripheral-contact member of said second port.

7. The updater device of claim 6, wherein said body has a first end at which said socket of said first port is located, and said body has a second end, distanced from said first end by approximately the width of a human hand, and at which second end said peripheral-contact member of said second port is located.

8. The updater device of claim 1, further comprising a status-indicator mechanism coupled to said controller, said status indicator-mechanism indicating by a signal visually or audibly perceptible to said user whether said controller is engaged in a one of several activities comprising reading source ROM data, erasing target ROM data, and writing data to said target ROM.

9. The updater device of claim 8, wherein said status-indicator mechanism is a plurality of LEDs, and each LED is associated with a one of said several activities, whereby a different one of said plurality of LEDs is illuminated depending on the one of said several activities in which said controller is engaged.

10. A process for updating a target read-only memory (ROM) in situ with a portable, self-powered, hand-held updater device, said method comprising the steps of:

(1) engaging a source ROM with a first port of a portable, self-powered, hand-held updater device, said first port of said updater device being adapted for maintaining engagement with said source ROM and for reading data therefrom while engaged therewith;

(2) engaging a second port of said updater device with a target ROM attached to a printed circuit board, said second port of said updater device being adapted for maintaining engagement with said target ROM and for reading data therefrom and writing data thereto, while engaged therewith;

(3) erasing a pre-existing datum on said target ROM via said second port;

(4) reading a datum from said source ROM via said first port;

(5) copying said datum read from said source ROM to said target ROM via said second port;

(6) reading said datum copied to said target ROM and comparing it with said datum read from said source ROM to determine whether the data are identical, thereby confirming the accuracy of said datum copied to said target ROM; and (7) at all times from steps (2) through (6), maintaining said target ROM in situ in said printed circuit board.

11. The process of claim 10, comprising after the step of confirming the accuracy of said datum copied to said target FROM, the further steps of:

(a) illuminating a first light-emitting diode (LED) corresponding to an accurate encoding when said datum is confirmed as identical to said datum read from said source ROM; and (b) illuminating a second LED corresponding to an inaccurate encoding when said datum is confirmed as non-identical to said datum read from said source ROM.

12. The process of claim 10, carried out a plurality of times with a plurality of source data from a source ROM and a plurality of target data in a target ROM.

13. The process of claim 10, wherein steps (3) through (6) are carried out with a programmed microprocessor chip, whereby said process is carried out automatically.

14. The process of claim 10, further comprising the following additional steps:

(a) as step (3) is carried out illuminating an erasure-indicator LED;

(b) as step (4) is carried out, illuminating a source-read-indicator LED; and (c) as step (5) is carried out, illuminating a copy-indicator LED.

15. The process of claim 10, wherein when step (6) is carried out there is illuminated a read-target indicator LED or a confirm-target indicator LED or a read-and-confirm-target indicator LED.

16. A self-powered, portable, hand-held, automatic, in situ updater device for read-only-memory (ROM) attached to a printed circuit board, said updater device comprising:

a portable body having a substantially cylindrical shape, adapted to be held in a user's hand, said body containing a controller, said controller comprising a programmed microprocessor chip, said body containing, connected to said controller, a battery for powering said controller;

coupled to said controller, a first port located at a first end of said body, said first port adapted for engaging, and maintaining engagement with, a source ROM, said first port adapted for reading data from said source ROM when engaged therewith;

coupled to said controller, a second port located at a second end of said body distanced from said first end of said body, said second port adapted for engaging, and maintaining engagement with, a target ROM that remains attached to a printed circuit board, said second port adapted for reading data from and writing data to said target ROM when engaged therewith;

said microprocessor adapted for, and programmed to automatically carry out in a predetermined sequence, the following operations when the controller is activated:

generating and transmitting to said second port erasure signals for erasing old data from said target ROM;

recovering and reading new data from said first port;

generating and transmitting to said second port re-write signals for writing said new data into said target ROM;

receiving and reading said new data from said target ROM via said second port;

comparing said new data read from said target ROM with said new data read from said first port, and confirming whether said compared data are identical to one another;

said body further containing a CONFIRM light-emitting diode (LED) coupled to said programmed microprocessor and adapted to light up when said programmed microprocessor confirms that said compared data are identical, and a NOT-CONFIRM LED coupled to said programmed microprocessor and adapted to light up when said programmed microprocessor confirms that said compared data are not identical.

\* \* \* \* \*